(12) United States Patent
Hu et al.

(10) Patent No.: US 12,727,333 B2
(45) Date of Patent: Sep. 1, 2026

(54) ARRAY SUBSTRATE, DISPLAY APPARATUS, AND MANUFACTURING METHOD FOR ARRAY SUBSTRATE

(71) Applicant: BOE Technology Group Co., Ltd., Beijing (CN)

(72) Inventors: Chunjing Hu, Beijing (CN); Li Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 546 days.

(21) Appl. No.: 18/270,954

(22) PCT Filed: Oct. 22, 2021

(86) PCT No.: PCT/CN2021/125510
§ 371 (c)(1),
(2) Date: Jul. 5, 2023

(87) PCT Pub. No.: WO2022/188411
PCT Pub. Date: Sep. 15, 2022

(65) Prior Publication Data

US 2024/0065037 A1 Feb. 22, 2024

(30) Foreign Application Priority Data

Mar. 12, 2021 (CN) ........................ 202110268140.7

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/8723* (2023.02); *H10K 71/00* (2023.02)

(58) Field of Classification Search
CPC ........................ H10K 59/122; H10K 59/1201
See application file for complete search history.

(56) References Cited

U.S. PATENT DOCUMENTS 11,056,544 B1 * 7/2021 Wei ...................... H10K 59/353
2013/0075737 A1 3/2013 Hong
(Continued)

FOREIGN PATENT DOCUMENTS

CN 107195796 A 9/2017
CN 108598110 A 9/2018
(Continued)

OTHER PUBLICATIONS

International Search Report and Written Opinion in PCT/CN2021/125510, mailed Jan. 26, 2022, 6 pages.

*Primary Examiner* — Mariceli Santiago
(74) *Attorney, Agent, or Firm* — ArentFox Schiff LLP; Michael Fainberg

(57) ABSTRACT

An array substrate includes a substrate, first pixel defining layers, second pixel defining layers, and spacer assemblies. The first pixel defining layers and the second pixel defining layers jointly define pixel regions. The first pixel defining layer is used for separating two columns of pixel regions adjacent in a first direction. The height of the second pixel defining layer is lower than the height of the first pixel defining layer. The spacer assemblies are disposed on the substrate and in one-to-one correspondence with the columns of pixel regions. Spacers in each spacer assembly extend along a second direction. The height of each spacer is used for matching the properties of the first pixel defining layers, such that pixel ink can be uniformly filled between two adjacent first pixel defining layers.

20 Claims, 6 Drawing Sheets

(51) Int. Cl.
*H10K 59/80* (2023.01)
*H10K 71/00* (2023.01)

(56) References Cited

U.S. PATENT DOCUMENTS

| | | | | |
|---|---|---|---|---|
| 2018/0358573 | A1* | 12/2018 | Maeda | H10K 50/16 |
| 2019/0206957 | A1* | 7/2019 | Yamada | H10K 50/818 |
| 2019/0273206 | A1 | 9/2019 | Fang et al. | |
| 2019/0326537 | A1* | 10/2019 | Kobayashi | H10K 50/16 |

FOREIGN PATENT DOCUMENTS

| | | | |
|---|---|---|---|
| CN | 110993675 | A | 4/2020 |
| CN | 111092100 | A | 5/2020 |
| CN | 111524947 | A | 8/2020 |

* cited by examiner

-- Prior Art --

-- Prior Art --

ARRAY SUBSTRATE, DISPLAY APPARATUS, AND MANUFACTURING METHOD FOR ARRAY SUBSTRATE

CROSS-REFERENCE TO RELATED APPLICATIONS

The present application is a National Stage of International Application No. PCT/CN2021/125510, filed Oct. 22, 2021, which claims the benefit of priority to Chinese Patent Application No. 202110268140.7, filed with the China National Intellectual Property Administration (CNIPA) on Mar. 12, 2021 and entitled "ARRAY SUBSTRATE, DISPLAY APPARATUS, AND MANUFACTURING METHOD FOR ARRAY SUBSTRATE", the entire contents of which are incorporated in the present application by reference.

TECHNICAL FIELD

The present disclosure relates to the field of display technology, and particularly to an array substrate, a display apparatus, and a manufacturing method for the array substrate.

BACKGROUND

An OLED (Organic Light-Emitting Diode) display device is considered to be a next generation display technology due to the advantages of self-luminescence, fast reaction, wide viewing angle, high luminance, bright color, lightness and thinness.

The film-forming methods of OLED mainly include an evaporation process and a solution process. The evaporation process is well established for small size applications and has been used in mass production. The OLED film-forming method of the solution-process includes mainly inkjet printing, nozzle coating, spin coating, screen printing and the like. The inkjet printing technology is the main mode of achieving large-sized OLED production due to its high material utilization rate, which enables large-sized OLED production.

However, in the case of inkjet printing, there will be a picture non-uniformity phenomenon because, on one hand, it is difficult to ensure that the volume of ink ejected per nozzle is completely uniform, and therefore, the human eye can discern the difference in uniformity of light emission between pixels caused by this volume error after the device is lit; on the other hand, since the size of the pixel defining region is small, the liquid flowing effect is poor, and it is difficult to form a thin film having a uniform film thickness, thereby affecting the luminous quality of the backplane.

In the related art, a line bank is adopted to improve the light-emitting uniformity of the display device. That is, two or more than two consecutive light-emitting subpixels on the same column (the light-emitting subpixels on the same column are of the same color) are confined in one bank (dam), while the portion of the bank located between the two light-emitting subpixels is lower than the film thickness of the light-emitting subpixels, and the portion of the bank extending in the direction of the column of the light-emitting subpixels is higher than the film thickness of the light-emitting subpixels. In this way, the pixel ink of the light emitting subpixels of the same color within one bank can flow mutually and spread uniformly.

A disadvantage of this approach is that the pitch between the two portions of the bank extending in the direction of the column of the light-emitting sub-pixels (the two portions are opposite) is small, and the light-emitting uniformity of the display device is still poor in the direction of the row of the light-emitting sub-pixels (i.e., in the two portions of the bank extending in the direction of the column of the light-emitting sub-pixels, one portion points in the direction to the other portion).

SUMMARY

The present disclosure provides an array substrate, a display apparatus and a manufacturing method for the array substrate, and is used to improve the problem that the light-emitting uniformity of the OLED display device is poor along the row direction of the light-emitting sub-pixels when the inkjet printing adopts a line bank structure.

To achieve the above objective, the present disclosure provides the following technical solutions.

An array substrate, including:

a substrate;

a plurality of first pixel defining layers arranged in a first direction on the substrate and a plurality of second pixel defining layers arranged in a second direction on the substrate, the first pixel defining layer extending along the second direction, the second pixel defining layer extending along the first direction, the first direction intersecting the second direction, the plurality of first pixel defining layers and the plurality of second pixel defining layers jointly defining a plurality of pixel regions arranged in an array; wherein each first pixel defining layer is used for separating two adjacent columns of pixel regions in the first direction, a height of the second pixel defining layer is lower than a height of the first pixel defining layer; and spacer assemblies disposed on the substrate and in one-to-one correspondence with columns of the pixel regions, spacers in each spacer assembly extending along the second direction, and a height of the spacers being used for matching properties of the first pixel defining layers, such that pixel ink is able to be uniformly filled between two adjacent first pixel defining layers.

Light-emitting subpixels of the same color are arranged in the column direction. Light-emitting subpixels of different colors are arranged in the row direction. In the prior art, there are two reasons why after the pixel film is formed, the light-emitting uniformity is poor along the row direction. The first reason is that the pixel defining layer extending in the column direction is a lyophilic pixel defining layer, and the pixel ink climbs the pixel defining layer so that the film thickness of the pixel ink adjacent to the pixel defining layer is larger than other parts, and the pixel ink is not uniform in film thickness or does not emit light. The second reason is that the pixel defining layer extending in the column direction is a lyophobic pixel defining layer, so that the film thickness of the pixel ink adjacent to the pixel defining layer is smaller than other parts, and the pixel ink is not uniform in film thickness or electric leakage occurs.

In the array substrate provided in the present disclosure, a plurality of first pixel defining layers arranged in the first direction and extending in the second direction and a plurality of second pixel defining layers arranged in the second direction and extending in the first direction are provided on the substrate. A plurality of pixel regions arranged in an array are defined by the plurality of first pixel defining layers and the plurality of second pixel defining layers together. Spacer assemblies are also provided on the substrate and are in one-to-one correspondence with the columns of pixel regions (i.e., the spacer assembly is provided between each two adjacent first pixel defining layers). The spacer assembly extends in the second direction. The height of the spacers in the spacer assembly can be matched with the properties of the first pixel defining layers, so that the pixel ink can be uniformly filled between the corresponding two adjacent first pixel defining layers, thus improving the problem of poor light-emitting uniformity of the OLED display device along the row direction of the pixel region.

Optionally, the first pixel defining layer is a lyophilic pixel defining layer.

The spacers in the spacer assembly are divided into a plurality of spacer groups arranged at intervals in the first direction. The heights of the spacer groups gradually decrease from the middle to both sides of the pixel region in the first direction.

Optionally, each spacer group includes one spacer.

Optionally, each spacer group includes at least two spacers arranged at intervals along the first direction. In one pixel region, the height of the spacer near the middle of the one pixel region is greater than or equal to the height of the spacer away from the middle of the one pixel region.

Optionally, in the one pixel region, in the first direction, the heights of the spacer groups decrease equally from the middle to both sides.

Optionally, the first pixel defining layer is a lyophobic pixel defining layer.

The spacers in the spacer assembly are divided into a plurality of spacer groups arranged at intervals in the first direction. The heights of the spacer groups gradually increase from the middle to both sides of the same pixel region in the first direction.

Optionally, each spacer group includes one spacer.

Optionally, each spacer group includes at least two spacers arranged at intervals. In one pixel region, the height of the spacer near the middle of the one pixel region in the first direction is smaller than or equal to the height of the spacer away from the middle of the one pixel region in the first direction.

Optionally, in the same one pixel region, in the first direction, the heights of the spacer groups increase equally from the middle to both sides.

Optionally, in the same one pixel region, the height of the highest spacer is 0.6-1.5 μm; and/or, the height of the lowest spacer in the same one pixel region is 0.2-0.6 μm.

Optionally, in the first direction, from the middle to both sides of the same one column of pixel regions, the pitch between two adjacent spacers decreases in sequence.

Optionally, in the first direction, from the middle to both sides of the same one column of pixel regions, the pitch between two adjacent spacers equally decreases.

Optionally, in the first direction, in the same one column of pixel regions, an average value of the pitch between two adjacent spacers is from 1/10 to 1/5 of a length of the pixel region in the first direction.

Optionally, the spacer is a lyophilic spacer and/or a cross-section of the spacer parallel to the first direction has a shape of a rectangle, a trapezoid, a triangle or an irregular polygon.

The present disclosure also provides a manufacturing method for an array substrate, including:

- preparing a plurality of first pixel defining layers arranged in a first direction and extending in a second direction on a substrate;
- preparing a spacer assembly between two adjacent first pixel defining layers on the substrate;
- preparing a plurality of second pixel defining layers arranged in the second direction and extending in the first direction on the substrate.

The first direction intersects the second direction. The plurality of first pixel defining layers and the plurality of second pixel defining layers jointly define a plurality of pixel regions arranged in an array. The first pixel defining layer is used for separating two adjacent columns of pixel regions in the first direction. A height of the second pixel defining layer is lower than a height of the first pixel defining layer. Spacers in each spacer assembly extend along the second direction. The height of the spacers is used for matching the properties of the first pixel defining layers, such that pixel ink is able to be uniformly filled between the corresponding two adjacent first pixel defining layers.

Employing the manufacturing method for the array substrate provided by the present disclosure enables to prepare the above array substrate, and can improve the problem that along the row direction of the pixel region, the light-emitting uniformity of the OLED display device is poor.

The present disclosure further provides a display apparatus, including any one array substrate provided in the above technical solution.

The display apparatus provided by the present disclosure includes the above array substrate, thereby achieving at least the technical effect that can be achieved by the array substrate, namely, improving the problem of poor light-emitting uniformity of the OLED display device along the row direction of the pixel region.

Reference numbers: 1—substrate; 2—first pixel defining layer; 3—second pixel defining layer; 4—pixel region; 5—spacer; 100—pixel defining layer extending in column direction; 200—light-emitting subpixel.

DETAILED DESCRIPTION

The technical solutions in the embodiments of the present disclosure will be clearly and completely described below in conjunction with the accompanying drawings in the embodiments of the present disclosure. It is obvious that the described embodiments are only a part of the embodiments of the present disclosure, rather than all of the embodiments. Based on the embodiments in the present disclosure, all other embodiments obtained by those of ordinary skill in the art without making inventive labor, belong to the scope of protection of the present disclosure.

Figure 1:
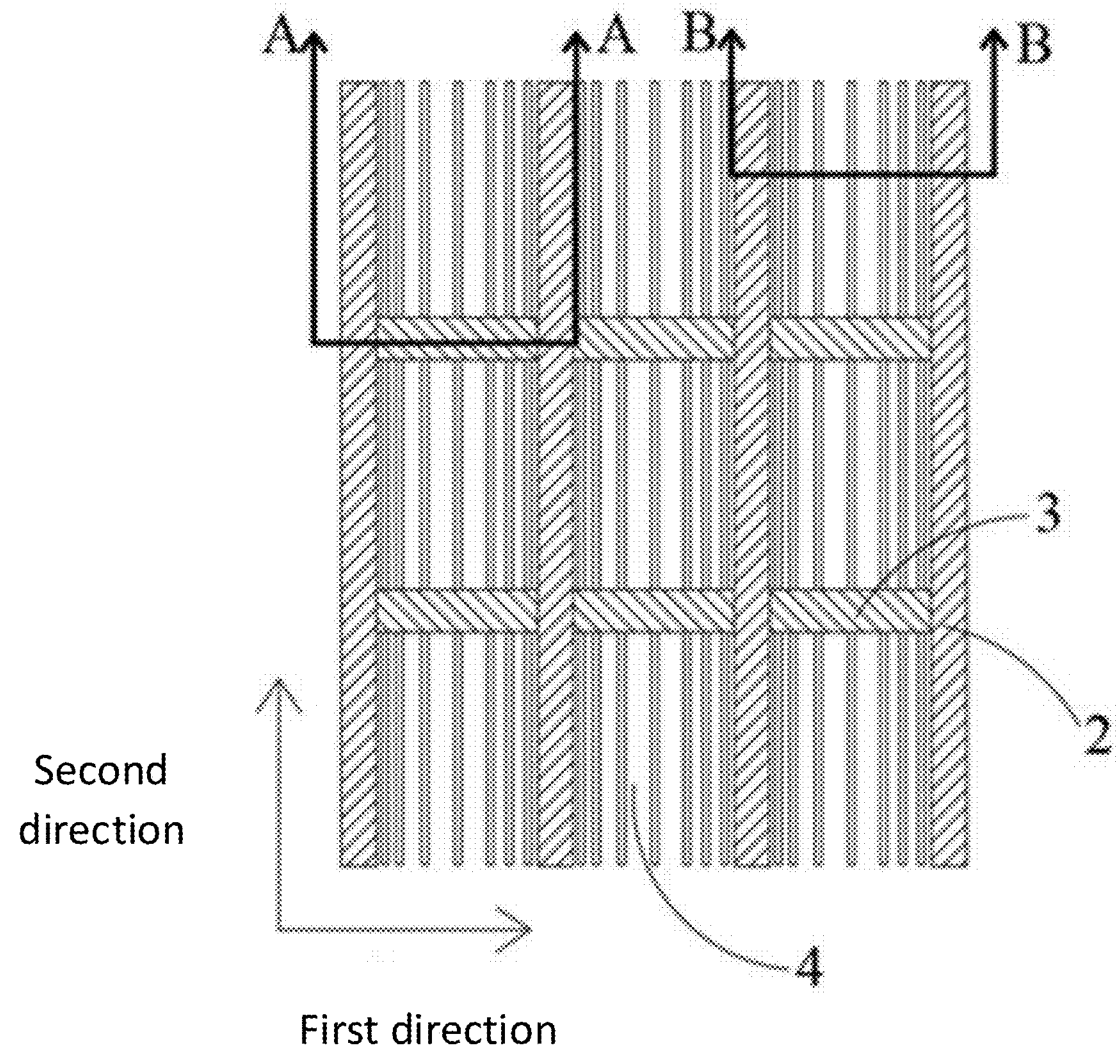
FIG. 1 is a front view of an array substrate provided by an embodiment of the present disclosure.

As shown in FIG. 1, embodiments of the present disclosure provide an array substrate, including:

substrate 1;

a plurality of first pixel defining layers 2 arranged in a first direction on the substrate 1 and a plurality of second pixel defining layers 3 arranged in a second direction on the substrate 1, the first pixel defining layer 2 extending along the second direction, the second pixel defining layer 3 extending along the first direction, the first direction intersecting the second direction, the plurality of first pixel defining layers 2 and the plurality of second pixel defining layers 3 jointly defining a plurality of pixel regions 4 arranged in an array, the first pixel defining layer 2 being used for separating two columns of pixel regions 4 adjacent in a first direction, a height of the second pixel defining layer 3 being lower than a height of the first pixel defining layer 2; and spacer assemblies disposed on the substrate 1 and in one-to-one correspondence with columns of the pixel regions 4, spacers 5 in each spacer assembly extending along the second direction, and the height of the spacers 5 being used for matching the properties of the first pixel defining layers 2, such that pixel ink is able to be uniformly filled between the corresponding two adjacent first pixel defining layers 2.

Figure 2:
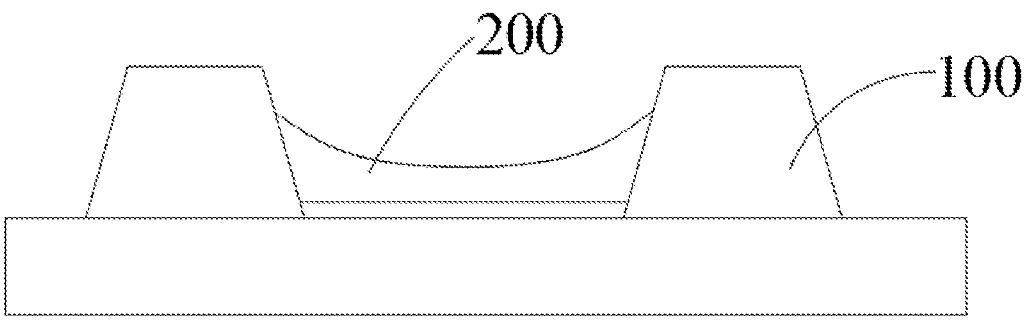
FIG. 2 is a structural schematic diagram of an array substrate in which a pixel defining layer extending in a column direction is a lyophilic pixel defining layer in the prior art.
Figure 3:
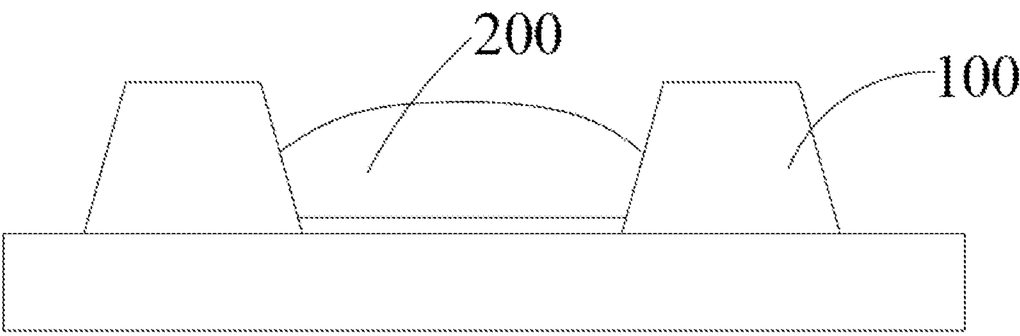
FIG. 3 is a structural schematic diagram of an array substrate in which a pixel defining layer extending in a column direction is a lyophobic pixel defining layer in the prior art.

The arrangement direction of the same-color light-emitting sub-pixels 200 is taken as the column direction, and the arrangement direction of the different color light-emitting sub-pixels 200 is taken as the row direction. In the prior art, there are two reasons why after the pixel film is formed, the light-emitting uniformity is poor along the row direction. The first reason is that the pixel defining layer 100 extending in the column direction is a lyophilic pixel defining layer, and the pixel ink climbs the pixel defining layer so that the film thickness of the pixel ink adjacent to the pixel defining layer is larger than other parts (as shown in FIG. 2), and the pixel ink is not uniform in film thickness or does not emit light. The second reason is that the pixel defining layer 100 extending in the column direction is a lyophobic pixel defining layer, so that the film thickness of the pixel ink adjacent to the pixel defining layer is smaller than other parts (as shown in FIG. 3), and the pixel ink is not uniform in film thickness or electric leakage occurs.

In the array substrate provided in the embodiments of the present disclosure, a plurality of first pixel defining layers 2 arranged in the first direction and extending in the second direction and a plurality of second pixel defining layers 3 arranged in the second direction and extending in the first direction are provided on the substrate 1. A plurality of pixel regions 4 arranged in an array are defined by the plurality of first pixel defining layers 2 and the plurality of second pixel defining layers 3 together. Spacer assemblies are also provided on the substrate 1 and are in one-to-one correspondence with the columns of pixel regions 4 (i.e., the spacer assembly is provided between each two adjacent first pixel defining layers 2). The spacer assembly extends in the second direction. The height(s) of the spacers 5 in the spacer assembly can be matched with the properties of the first pixel defining layers 2, so that the pixel ink can be uniformly filled between the corresponding two adjacent first pixel defining layers 2, improving the problem of poor light-emitting uniformity of the OLED display device along the row direction of the pixel region 4.

Figure 4:
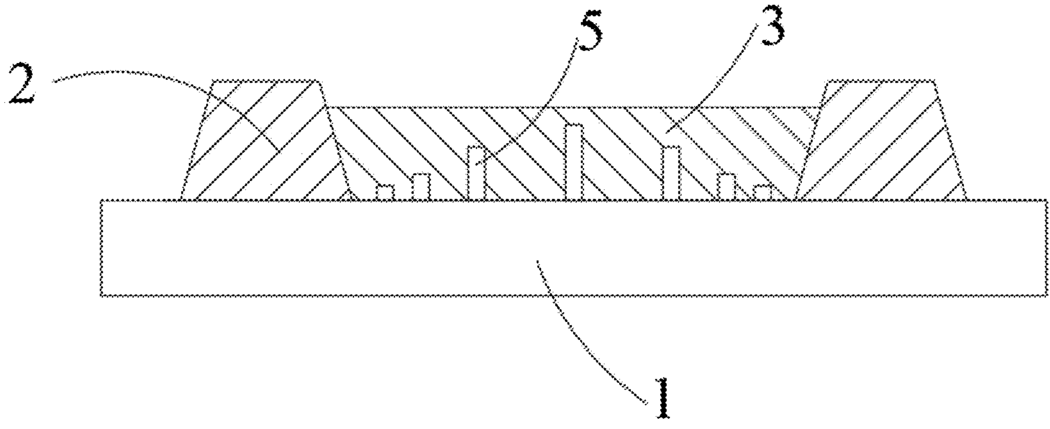
FIG. 4 is a sectional view A-A in FIG. 1 when a first pixel defining layer is a lyophilic pixel defining layer in the array substrate provided by an embodiment of the present disclosure.
Figure 5:
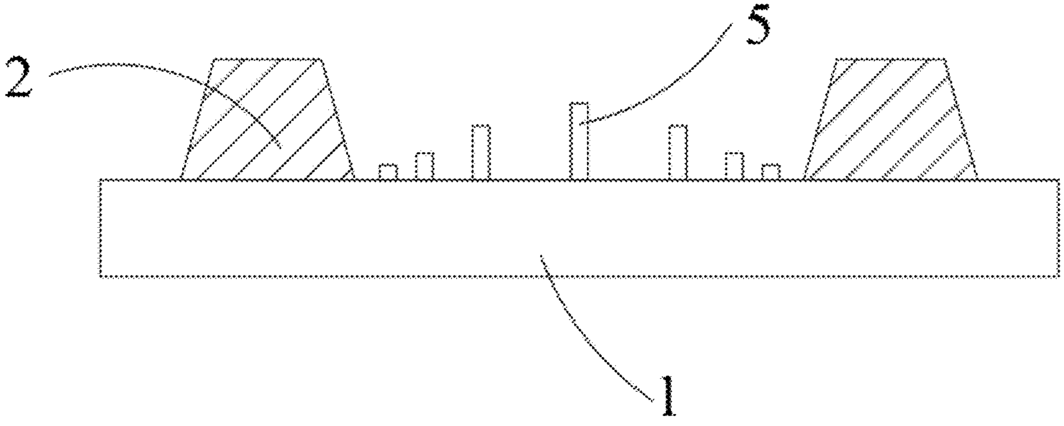
FIG. 5 is a sectional view B-B in FIG. 1 when the first pixel defining layer is a lyophilic pixel defining layer in the array substrate provided by an embodiment of the present disclosure.

When the above first pixel defining layer 2 is provided, the first pixel defining layer 2 can be a lyophilic pixel defining layer. When the above-described spacer assembly is provided, as shown in FIGS. 4 and 5, the spacers in the spacer assembly may be divided into a plurality of spacer groups arranged at intervals in the first direction, and the heights of the spacer groups in the pixel region 4 are gradually decreased from the middle to both sides of the pixel region 4 in the first direction.

In the first direction, the height of the spacer group is gradually decreased from the middle to both sides. A lower spacer group pulls down the height of the pixel ink close to the first pixel defining layer 2. Considering that the amplitude of the pixel ink climbing the first pixel defining layer 2 is large, in the embodiments, the height of the pixel ink climbing the first pixel defining layer 2 is gradually lowered by a plurality of spacer groups whose heights are gradually lowered from the middle to both sides in the first direction. Further, the middle spacer group pulls up the pixel ink which is originally lower in the middle, thereby improving the uniformity of the film thickness of the pixel ink in the first direction, resulting in better light-emitting uniformity of the OLED display device along the row direction of the pixel regions 4.

When the spacer groups are arranged, each spacer group can include one spacer 5. In order to increase the density of the spacers to make the uniformity of the film thickness of the pixel ink in the first direction better within the pixel region 4, the spacer group may also include at least two spacers 5 arranged at intervals in the first direction.

When the spacer group includes at least two spacers 5 arranged at intervals in the first direction, the height of the spacer 5 near the middle of the pixel region 4 in the same spacer group may be equal to the height of the spacer far from the middle of the pixel region 4. In order to further improve the uniformity of the film thickness of the pixel ink in the first direction within the pixel region 4, the height of the spacers near the middle of the pixel region 4 in the same spacer group is preferably greater than the height of the spacer 5 far from the middle of the pixel region 4.

In order to simplify the manufacturing process while further improving the uniformity of the film thickness of the pixel ink in the first direction, in an alternative implementation, in the same pixel region, in the first direction, the height of each spacer group decreases equally from the middle to both sides.

Figure 6:
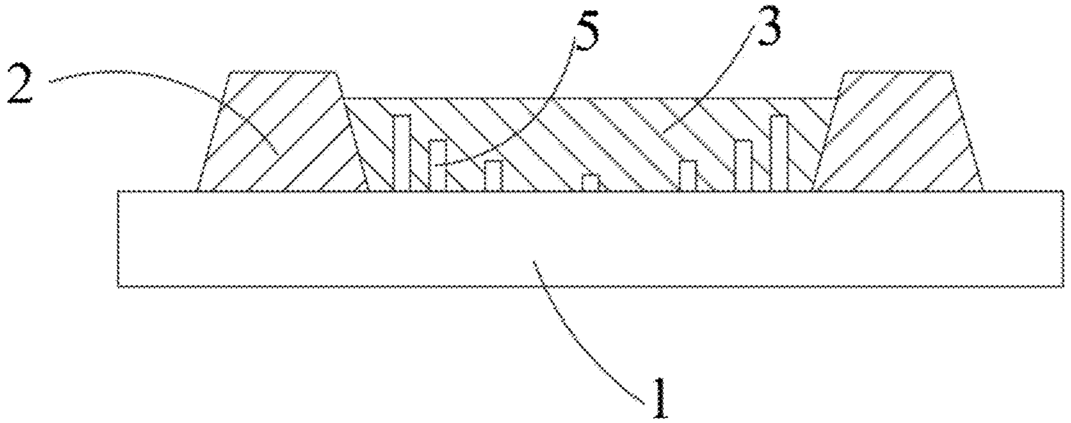
FIG. 6 is a sectional view A-A in FIG. 1 when the first pixel defining layer is a lyophobic pixel defining layer in the array substrate provided by an embodiment of the present disclosure.
Figure 7:
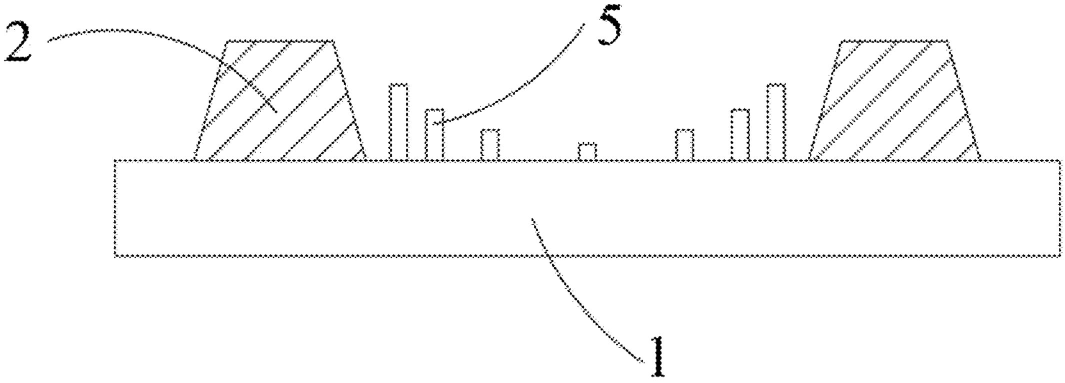
FIG. 7 is a sectional view B-B in FIG. 1 when the first pixel defining layer is a lyophobic pixel defining layer in the array substrate provided by an embodiment of the present disclosure.

In alternative implementations, as shown in FIGS. 6 and 7, the first pixel defining layer 2 may also be a lyophobic pixel defining layer. The spacers in the spacer assembly are divided into a plurality of spacer groups arranged at intervals in the first direction, and the height of each spacer group increases gradually from the middle to both sides of the pixel region 4 in the first direction.

In the first direction, the height of each spacer group gradually increases from the middle to both sides. The taller spacer group will pull up the height of the pixel ink close to the first pixel defining layer 2. Considering the greater decrease in film thickness magnitude of the pixel ink adjacent to the first pixel defining layer 2, in the present embodiments, in the first direction, the height of the pixel ink is gradually raised by a plurality of spacer groups whose heights are gradually increased from the middle to both sides. Further, the pixel ink having a higher height in the middle is pulled down by the middle spacer group, thereby improving the uniformity of the film thickness of the pixel ink in the first direction, so that the light-emitting uniformity of the OLED display apparatus is better in the row direction of the pixel regions 4.

When the above-mentioned spacer groups are provided, each spacer group includes one spacer 5. In order to increase the density of the spacers so that the uniformity of the film thickness of the pixel ink in the first direction within the pixel region 4 is better, the spacer group may also include at least two spacers 5 arranged at intervals in the first direction.

When the spacer group includes at least two spacers 5 disposed at intervals in the first direction, the height of the spacer 5 close to the middle of the pixel region 4 in the first direction in the same spacer group may be equal to the height of the spacer away from the middle of the pixel region 4 in the first direction. In order to further improve the uniformity of the film thickness of the pixel ink in the first direction within the pixel region 4, the height of the spacer closer to the middle of the pixel region 4 in the same spacer group is preferably smaller than the height of the spacer away from the middle of the pixel region 4.

In order to simplify the manufacturing process while further improving the uniformity of the film thickness of the pixel ink in the first direction, in an alternative implementation, the height of each spacer group is equally increased from the middle to both sides of the same pixel region in the first direction.

On the basis of the above embodiments, in an alternative implementation, in the same pixel region, the height of the highest spacer is 0.6-1.5 μm and the height of the lowest spacer is 0.2-0.6 μm.

On the basis of the above embodiments, in alternative implementations, in the first direction, from the middle of the same column of pixel regions to both sides, the pitch between two adjacent spacers decreases in sequence.

When the first pixel defining layer is a lyophobic pixel defining layer, in a first direction, the height reduction of the pixel ink on both sides within the pixel region 4 is severe. When the first pixel defining layer is a lyophilic pixel defining layer, the climbing of the pixel ink on both sides of the pixel region 4 in the first direction is severe. The pitch between two adjacent spacers 5 is successively reduced from the middle to both sides in the first direction, so that the uniformity of the film thickness of the pixel ink can be better ensured.

In order to further improve the uniformity of the film thickness of the pixel ink in the first direction, in an alternative implementation, in the first direction, from the middle to both sides of the same column of pixel regions, the pitch between two adjacent spacers is equally reduced.

Optionally, in the same column of pixel regions in the first direction, an average value of the pitch between two adjacent spacers is from 1/10 to 1/5 of a length of the pixel region in the first direction.

When the above-described spacer 5 is provided, the spacer 5 may be a lyophilic spacer, and a cross-section of the spacer 5 parallel to the first direction has a shape of a rectangle, a trapezoid, a triangle or an irregular polygon.

Figure 8:
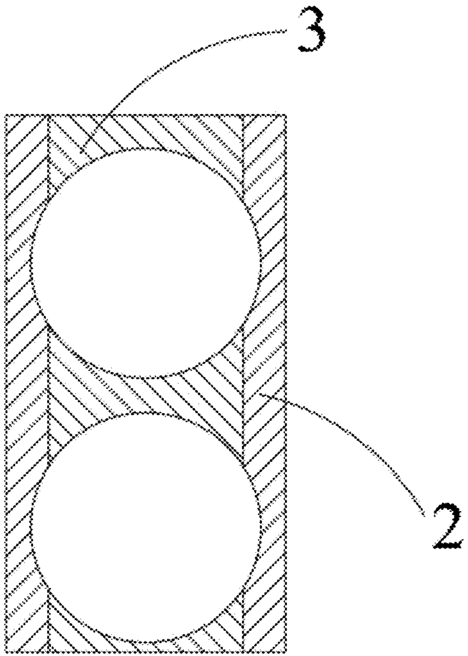
FIG. 8 is a partial structural schematic diagram of another array substrate provided by an embodiment of the present disclosure.
Figure 9:
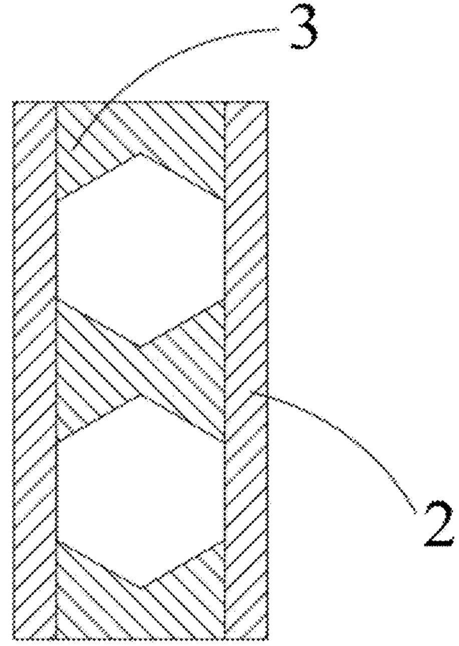
FIG. 9 is a partial structural schematic diagram of another array substrate provided by an embodiment of the present disclosure.
Figure 10:
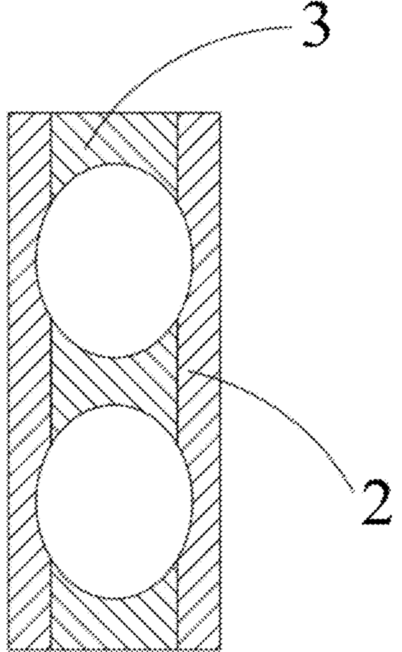
FIG. 10 is a partial structural schematic diagram of another array substrate provided by an embodiment of the present disclosure.

It should be noted that the pixel region 4 in the embodiments may be a rectangle as shown in FIG. 1, or may have other shapes such as a circular shape (as shown in FIG. 8), a hexagonal shape (as shown in FIG. 9), an elliptical shape (as shown in FIG. 10), or the like.

The present embodiments provide a manufacturing method for an array substrate, including the following steps.

Step S1, a plurality of first pixel defining layers 2 arranged in a first direction and extending in a second direction are prepared on a substrate 1.

Step S2, a spacer assembly is prepared between two adjacent first pixel defining layers 2 on the substrate 1.

Step S3, a plurality of second pixel defining layers 3 arranged in the second direction and extending in the first direction are prepared on the substrate 1. The first direction intersects the second direction. The plurality of first pixel defining layers 2 and the plurality of second pixel defining layers 3 jointly define a plurality of pixel regions 4 arranged in an array. Each first pixel defining layer 2 is used for separating two adjacent columns of pixel regions 4 in a first direction. A height of the second pixel defining layer 3 is lower than a height of the first pixel defining layer 2. Spacers in each spacer assembly extend along the second direction. The height of each spacer is used for matching the properties of the first pixel defining layers 2, such that pixel ink is able to be uniformly filled between the corresponding two adjacent first pixel defining layers 2.

Step S4, the pixel ink is sprayed in each pixel region 4.

The manufacturing method for the array substrate provided by the embodiments is employed to prepare the above array substrate, and can improve the problem that along the row direction of the pixel regions 4, the light-emitting uniformity of the OLED display apparatus is poor.

In alternative implementations, the manufacturing method for the array substrate may include the following steps.

Step S01, a first electrode layer is prepared on a substrate 1.

In particular, the first electrode layer may be prepared on a planarization layer of the substrate 1. The first electrode layer may be an anode layer.

Step S02, a light-emitting layer is prepared on the first electrode layer.

Step S03, a second electrode layer is prepared on the light-emitting layer. The second electrode layer may be a cathode layer.

A bottom emitting device structure may be formed by providing a transparent anode layer and a reflective cathode layer, or a top emitting device structure may be formed by providing a transparent cathode layer and a reflective anode layer. Depending on the device structure, the choice of the anode material is also different, which is usually a transparent or translucent material with high work function such as ITO, Ag, NiO, Al and graphene.

Step S05, a first film layer for forming a first pixel defining layer is prepared on the first electrode layer. A photoresist layer is disposed on the first film layer, and exposure, development, and etching are performed to prepare the first pixel defining layer.

The first film layer is generally formed by spin coating or slit coating, and the height of the first pixel defining layer may be 0.1 μm to 100 μm, preferably 1 μm to 5 μm.

Step S06, a spacer film layer for forming a spacer assembly is prepared on the first electrode layer, a photoresist layer is disposed on the spacer film layer, a half-tone mask is selected, and exposure, development, and etching are performed to prepare the spacer assembly.

Step S07, a second film layer for forming a second pixel defining layer is prepared on the first electrode layer, a photoresist layer is prepared on the second film layer, and exposure, development, and etching are performed to prepare the second pixel defining layer, and meanwhile, the pixel regions 4 arranged in an array are formed.

Step S08, the pixel ink is sprayed in each pixel region 4.

A display apparatus provided by embodiments of the present disclosure includes the array substrate described in the above contents.

The display apparatus provided by the embodiments includes the above array substrate, thus at least the technical effect that can be achieved by the above array substrate can be achieved, that is, the problem of poor light-emitting uniformity of the OLED display apparatus along the row direction of the pixel regions 4 is improved.

It will be apparent to those skilled in the art that various modifications and variations can be made in the present disclosure without departing from the spirit and scope of the disclosure. Thus, it is intended that the present disclosure cover the modifications and variations of this disclosure provided they come within the scope of the appended claims and their equivalents.

What is claimed is:

1. An array substrate, comprising:

a substrate;

a plurality of first pixel defining layers arranged in a first direction on the substrate and a plurality of second pixel defining layers arranged in a second direction on the substrate, the first pixel defining layer extending along the second direction, the second pixel defining layer extending along the first direction, the first direction intersecting the second direction, and the plurality of first pixel defining layers and the plurality of second pixel defining layers jointly defining a plurality of pixel regions arranged in an array; wherein the first pixel defining layer is used for separating two adjacent columns of pixel regions in the first direction, and a height of the second pixel defining layer is lower than a height of the first pixel defining layer; and spacer assemblies disposed on the substrate and in one-to-one correspondence with columns of the pixel regions, spacers in each spacer assembly extending along the second direction, and a height of the spacers being used for matching properties of the first pixel defining layers, such that pixel ink is able to be uniformly filled between two adjacent first pixel defining layers;

wherein the spacers in each spacer assembly are independent and separated from each other and are arranged in the first direction, and each of the spacers extends continuously in the second direction.

2. The array substrate according to claim 1, wherein the first pixel defining layer is a lyophilic pixel defining layer; and the spacers in the spacer assembly are divided into a plurality of spacer groups arranged at intervals in the first direction, and heights of the spacer groups gradually decrease from middle to both sides of the pixel region in the first direction.

3. The array substrate according to claim 2, wherein each spacer group comprises one spacer.

4. The array substrate according to claim 2, wherein each spacer group comprises at least two spacers arranged at intervals along the first direction, and in one pixel region, the height of the spacer near the middle of the one pixel region is greater than or equal to the height of the spacer away from the middle of the one pixel region.

5. The array substrate according to claim 2, wherein the heights of the spacer groups decrease equally from the middle to both sides of the pixel region in the first direction.

6. The array substrate according to claim 2, wherein:

the height of a highest spacer in the pixel region is 0.6-1.5 μm; and/or, the height of a lowest spacer in the pixel region is 0.2-0.6 μm.

7. The array substrate according to claim 2, wherein from middle to both sides of one column of pixel regions in the first direction, a pitch between two adjacent spacers decreases in sequence.

8. The array substrate according to claim 7, wherein from the middle to both sides of the one column of pixel regions in the first direction, the pitch between two adjacent spacers equally decreases.

9. The array substrate according to claim 8, wherein an average value of the pitch between two adjacent spacers in the one column of pixel regions in the first direction is from 1/10 to 1/5 of a length of the pixel region in the first direction.

10. The array substrate according to claim 1, wherein the first pixel defining layer is a lyophobic pixel defining layer; and the spacers in the spacer assembly are divided into a plurality of spacer groups arranged at intervals in the first direction, and heights of the spacer groups gradually increase from middle to both sides of the pixel region in the first direction.

11. The array substrate according to claim 10, wherein each spacer group comprises one spacer.

12. The array substrate according to claim 10, wherein each spacer group comprises at least two spacers arranged at intervals, and in one pixel region, the height of the spacer near the middle of the one pixel region in the first direction is smaller than or equal to the height of the spacer away from the middle of the one pixel region in the first direction.

13. The array substrate according to claim 10, wherein the heights of the spacer groups increase equally from the middle to both sides of the pixel region in the first direction.

14. The array substrate according to claim 10, wherein from middle to both sides of one column of pixel regions in the first direction, a pitch between two adjacent spacers decreases in sequence.

15. The array substrate according to claim 1, wherein:

the spacer is a lyophilic spacer; and/or a cross-section of the spacer parallel to the first direction has a shape of a rectangle, a trapezoid, a triangle or an irregular polygon.

16. A manufacturing method for the array substrate according to claim 1, comprising:

preparing the plurality of first pixel defining layers arranged in the first direction and extending in the second direction on the substrate;

preparing the spacer assembly between two adjacent first pixel defining layers on the substrate; and preparing the plurality of second pixel defining layers arranged in the second direction and extending in the first direction on the substrate;

wherein the first direction intersects the second direction, the plurality of first pixel defining layers and the plurality of second pixel defining layers jointly define the plurality of pixel regions arranged in an array; the first pixel defining layer is used for separating two adjacent columns of pixel regions in the first direction, the height of the second pixel defining layer is lower than the height of the first pixel defining layer; spacers in each spacer assembly extend along the second direction, and the height of the spacers is used for matching properties of the first pixel defining layers, such that pixel ink is able to be uniformly filled between two adjacent first pixel defining layers;

wherein the spacers in each spacer assembly are independent and separated from each other and are arranged in the first direction, and each of the spacers extends continuously in the second direction.

17. A display apparatus, comprising: the array substrate according to claim 1.

18. An array substrate, comprising:

a substrate;

a plurality of first pixel defining layers arranged in a first direction on the substrate and a plurality of second pixel defining layers arranged in a second direction on the substrate, the first pixel defining layer extending along the second direction, the second pixel defining layer extending along the first direction, the first direction intersecting the second direction, and the plurality of first pixel defining layers and the plurality of second pixel defining layers jointly defining a plurality of pixel regions arranged in an array; wherein the first pixel defining layer is used for separating two adjacent columns of pixel regions in the first direction, and a height of the second pixel defining layer is lower than a height of the first pixel defining layer; and spacer assemblies disposed on the substrate and in one-to-one correspondence with columns of the pixel regions, spacers in each spacer assembly extending along the second direction, and a height of the spacers being used for matching properties of the first pixel defining layers, such that pixel ink is able to be uniformly filled between two adjacent first pixel defining layers;

wherein the spacers in each spacer assembly are divided into a plurality of spacer groups arranged at intervals in the first direction, each of the plurality of spacer groups comprises at least two spacers arranged at intervals along the first direction, and heights of the at least two spacers in the spacer group are equal.

19. The array substrate according to claim 18, wherein the first pixel defining layer is a lyophilic pixel defining layer;

heights of the spacer groups in the spacer assembly gradually decrease from middle to both sides of the pixel region corresponding to the spacer assembly in the first direction.

20. The array substrate according to claim 18, wherein the first pixel defining layer is a lyophobic pixel defining layer;

heights of the spacer groups in the spacer assembly gradually increase from middle to both sides of the pixel region corresponding to the spacer assembly in the first direction.

* * * * *